(12) United States Patent
Cheng et al.

(10) Patent No.: US 10,374,064 B2
(45) Date of Patent: *Aug. 6, 2019

(54) FIN FIELD EFFECT TRANSISTOR COMPLEMENTARY METAL OXIDE SEMICONDUCTOR WITH DUAL STRAINED CHANNELS WITH SOLID PHASE DOPING

(71) Applicants: INTERNATIONAL BUSINESS MACHINES CORPORATION, Armonk, NY (US); GLOBALFOUNDRIES INC., Grand Cayman (KY)

(72) Inventors: Kangguo Cheng, Schenectady, NY (US); Ruilong Xie, Niskayuna, NY (US); Tenko Yamashita, Schenectady, NY (US)

(73) Assignees: International Business Machines Corporation, Armonk, NY (US); Globalfoundries, Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/901,447

(22) Filed: Feb. 21, 2018

(65) Prior Publication Data

US 2018/0182867 A1    Jun. 28, 2018

Related U.S. Application Data

(63) Continuation of application No. 14/925,630, filed on Oct. 28, 2015, now Pat. No. 9,947,774.

(51) Int. Cl.
*H01L 21/225* (2006.01)
*H01L 29/66* (2006.01)
(Continued)

(52) U.S. Cl.
CPC ...... *H01L 29/66795* (2013.01); *H01L 21/225* (2013.01); *H01L 21/823807* (2013.01);
(Continued)

(58) Field of Classification Search
None
See application file for complete search history.

(56) References Cited

U.S. PATENT DOCUMENTS 6,221,724 B1    4/2001  Yu et al.
7,525,160 B2    4/2009  Kavalieros et al.
(Continued)

OTHER PUBLICATIONS

List of IBM Patents or Patent Applications Treated as Related dated Feb. 21, 2018, 2 pages.
(Continued)

*Primary Examiner* — Fernando L Toledo
*Assistant Examiner* — Valerie N Newton
(74) *Attorney, Agent, or Firm* — Tutunjian & Bitetto, P.C.; Vazken Alexanian

(57) ABSTRACT

A method of forming semiconductor devices that includes forming an oxide that is doped with a punch through dopant on a surface of a first semiconductor material having a first lattice dimension, and diffusing punch through dopant from the oxide into the semiconductor material to provide a punch through stop region. The oxide may then be removed. A second semiconductor material may be formed having a second lattice dimension on the first semiconductor material having the first lattice dimension. A difference between the first lattice dimension and the second lattice dimension forms a strain in the second semiconductor material. A gate structure and source and drain regions are formed on the second semiconductor material.

20 Claims, 8 Drawing Sheets

(51) Int. Cl.
  *H01L 29/78* (2006.01)
  *H01L 21/8238* (2006.01)
  *H01L 27/092* (2006.01)
  *H01L 29/10* (2006.01)
  *H01L 29/165* (2006.01)

(52) U.S. Cl.
  CPC .. *H01L 21/823821* (2013.01); *H01L 27/0924* (2013.01); *H01L 29/1083* (2013.01); *H01L 29/165* (2013.01); *H01L 29/66803* (2013.01); *H01L 29/785* (2013.01); *H01L 29/7848* (2013.01)

(56) References Cited

U.S. PATENT DOCUMENTS

| | | | |
|---|---|---|---|
| 8,394,710 B2 | 3/2013 | Cheng et al. | |
| 8,420,459 B1 | 4/2013 | Cheng et al. | |
| 8,610,201 B1 | 12/2013 | Hokazono | |
| 8,766,364 B2 | 7/2014 | Doornbos et al. | |
| 8,877,588 B2 | 11/2014 | Pham et al. | |
| 9,000,498 B2 | 4/2015 | Morin | |
| 9,947,774 B2* | 4/2018 | Cheng | H01L 29/66795 |
| 2014/0151766 A1 | 6/2014 | Eneman et al. | |
| 2014/0312393 A1 | 10/2014 | Rodder et al. | |
| 2016/0336428 A1* | 11/2016 | Cheng | H01L 29/66795 |
| 2016/0343623 A1* | 11/2016 | Fogel | H01L 21/823878 |

OTHER PUBLICATIONS

Eneman et al., "Stress Techniques in Advanced Transistor Architectures: Bulk FinFETs and Implant-Free Quantum Well Transistors" ECS Transactions, vol. 45, No. 3, Jun. 2012, pp. 235-246.
U.S. Office Action issued in U.S. Appl. No. 15/298,648, dated Aug. 28, 2017, pp. 1-8.

* cited by examiner

FIN FIELD EFFECT TRANSISTOR COMPLEMENTARY METAL OXIDE SEMICONDUCTOR WITH DUAL STRAINED CHANNELS WITH SOLID PHASE DOPING

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming semiconductor devices is provided in which the strained materials and punch through stop (PTS) regions are integrated into the fin structures. In one embodiment, the method includes forming an oxide that is doped with a punch through dopant on a surface of a first semiconductor material having a first lattice dimension. The punch through dopant from the oxide is diffused into the semiconductor material having a first lattice dimension to provide a punch through stop region. The oxide is removed. A second semiconductor material having a second lattice dimension is formed on the first semiconductor material having the first lattice dimension, wherein a difference between the first lattice dimension and the second lattice dimension forms a strain in the second semiconductor material. A gate structure and source and drain regions are formed on the second semiconductor material.

In another embodiment, a method of forming a complementary metal oxide semiconductor device arrangement is provided that includes forming a first doped oxide having a first conductivity type dopant on a first region of a semiconductor substrate having a first lattice dimension, and forming a second doped oxide having a second conductivity type dopant on a second region of the semiconductor substrate. The first and second conductivity type dopants for the first and second doped oxides are diffused into the first and second region of the semiconductor substrate. The first conductivity type dopant that diffuses into the first region of the substrate provides a first conductivity type punch through stop region, and the second conductivity type dopant that diffuses into the second region of the substrate provides a second conductivity type punch through stop region. The first and second doped oxide layers are removed. At least a second semiconductor material having at least a second lattice dimension is formed on the semiconductor substrate, wherein a difference between the first lattice dimensions and at least the second lattice dimension forms a strain in said at least said second semiconductor material. A first semiconductor device having a second conductivity type is formed in the region of the semiconductor substrate, and a second semiconductor device having a first conductivity type is formed in the second region of the semiconductor substrate.

In another aspect of the present disclosure, a semiconductor device is provided that includes a fin structure having a strained active region portion, and a punch through stop region underlying the strained active region. The punch through stop region may have a graded dopant concentration with a highest concentration at an interface with the strained active region, and a decreasing concentration in punch through dopant in a direction away from the interface with the strained active region.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
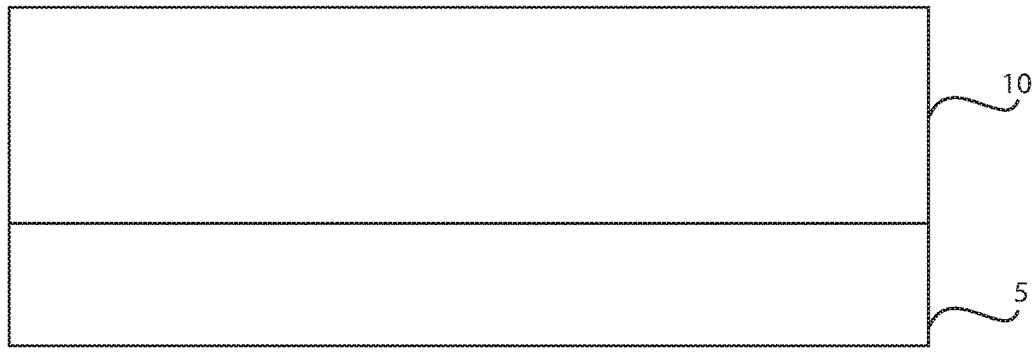
FIG. 1 is a side cross-sectional view that depicts forming a semiconductor material layer having a first lattice dimension on a semiconductor substrate, in which the thickness of the semiconductor material layer is selected to provide a relaxed surface, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure.

In some embodiments, the methods and structures disclosed herein provide semiconductor devices including strained materials and punch through stop (PTS) regions. It has been determined that FinFET scaling beyond the 10 nm node may call for strained fin channels to boost device performance. Epitaxially growing tensile strained silicon (Si) and compressively strained high germanium (Ge) content silicon germanium (SiGe) on relaxed buffer layers, e.g., low germanium (Ge) content silicon germanium can be a viable option to achieve stained bulk complementary metal oxide semiconductor (CMOS) Fin Field Effect Transistors (FinFETs). Punch through stopper (PTS) regions can also be advantageous to devices formed from bulk substrates to suppress punch through leakage current under the fin channel. Typically, ion implantation has been employed to form punch through stopper (PTS) regions. It has been determined that forming PTS regions using ion implantation typically has a number of disadvantages. For example, ion implantation turns can cause damage to semiconductor material layers. While that type of damage can be annealed out in the conventional non-strained Si fins, damages in the strained semiconductor, particularly strained SiGe fins, causes the strain in SiGe fins to relax, defeating the strain benefits. Further, ideal PTS doping should be right underneath fin channel without encroaching into the final channel, because undesired dopants in fin channel causes random doping fluctuation and thus increases device variability. However, due to the straggling nature of ion implantation, residual dopants are formed in fin channel when forming punch through stopper regions using ion implantation. Additionally, CMOS processing typically requires an n-type punch through stopper (PTS) doping for p-type field effect transistors (PFET) and p-type PTS doping for n-type field effect transistors (NFET). In order to form N-type and P-type PTS doping regions by implantation, two masks have to be used. One mask to cover NFET region during PFET PTS implant and the other mask to cover PFET region during NFET PTS implantation. Two masks increase process complexity and cost.

In some embodiments, the present disclosure provides a method and structure for forming FinFET CMOS with tensile strained silicon (Si) NFET and compressively strained silicon germanium (SiGe) PFET on a strain relaxed buffer (SRB) layer, e.g., strained relaxed buffer layer of silicon germanium (SiGe). In accordance with some embodiments of the present disclosure, the punch through stopper (PTS) doping region is formed in SRB layer before epitaxially growing the strained fin channel. Furthermore, in some embodiments of the present disclosure, a single mask is used to form N-type PTS doping for PFET devices, and P-type PTS doping for NFET devices.

In some embodiments, the methods and structures disclosed herein can provide that no implantation-related damage is present in the strained channels of the fin structures. In some embodiments, the methods and structures disclosed herein can provide that the punch through stopper (PTS) region is formed right underneath fin channel without undesired dopant fluctuations in fin channel. Further, the methods disclosed herein can use a single mask to form the punch through stopper (PTS) regions, which can provide a cost savings over prior methods.

The methods and structures of the present disclosure are now discussed with more detail referring to FIGS. 1-8.

FIG. 1 depicts forming a semiconductor material layer 10 having a first lattice dimension on a semiconductor substrate 5, in which the thickness of the semiconductor material layer 10 is selected to provide a relaxed surface.

The semiconductor substrate 5 may be a bulk semiconductor substrate. In some embodiments, the semiconductor substrate 5 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. Typically, the semiconductor substrate 5 is composed of silicon (Si), e.g., single crystal silicon.

FIG. 1 further depicts a semiconductor material layer 10 being present on the semiconductor substrate 5, in which the semiconductor material layer 10 is relaxed. The term "relaxed" denotes a semiconductor material layer that does not have an internal strain, in which the lattice dimension in the direction parallel to the channel plane (x-direction), perpendicular to the channel plane (y-direction) and out of the channel plane (z-direction) are the same. In some embodiments, a semiconductor material layer 10 that is substantially relaxed has a strain no greater than about +/−0.1 GPa tensile or compressive. In one example, the semiconductor material layer 10 may be completely relaxed.

In one embodiment, the relaxed semiconductor layer 10 may be composed of silicon germanium (SiGe). In some embodiments, the relaxed semiconductor layer may be composed of silicon germanium (SiGe) having a low germanium content (Ge). For example, the relaxed semiconductor layer 10 may be composed of silicon germanium (SiGe), in which the germanium (Ge) content is 25% or less. It is noted that the above examples for relaxed semiconductor materials is provided for illustrative purposes only, and the present disclosure is not intended to be limited to only these examples. Any semiconductor material may be suitable for the relaxed semiconductor layer 10, so long as the material selected has a lattice dimension that can provide a deposition surface for the later formed strained semiconductor materials that provide the active region of the fin structures.

In some embodiments, the relaxed semiconductor layer 10 may be formed using a deposition process, such as epitaxial deposition. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial semiconductor material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The epitaxial deposition process may employ a chemical vapor deposition apparatus, e.g., plasma enhanced chemical vapor deposition (PECVD), metal organic chemical vapor deposition (MOCVD).

The relaxed semiconductor layer 10 typically has a different lattice dimension than the semiconductor substrate 5 on which it is formed. Therefore, to provide a relaxed surface the relaxed semiconductor layer 10 is grown to a thickness that allows for strain relaxation in the deposited material layer. For example, when the semiconductor substrate 5 is composed of silicon (Si), and the relaxed semiconductor layer 10 is composed of silicon germanium (SiGe), to provide for a relaxed strain profile, the relaxed semiconductor layer 10 may be deposited to a thickness that is equal to 300 nm or greater. In another example, when the semiconductor substrate 5 is composed of silicon (Si), and the relaxed semiconductor layer 10 is composed of silicon germanium, to provide for a relaxed strain profile, the relaxed semiconductor layer 10 may be deposited to a thickness that ranges from 200 nm to 4000 nm.

Figure 2:
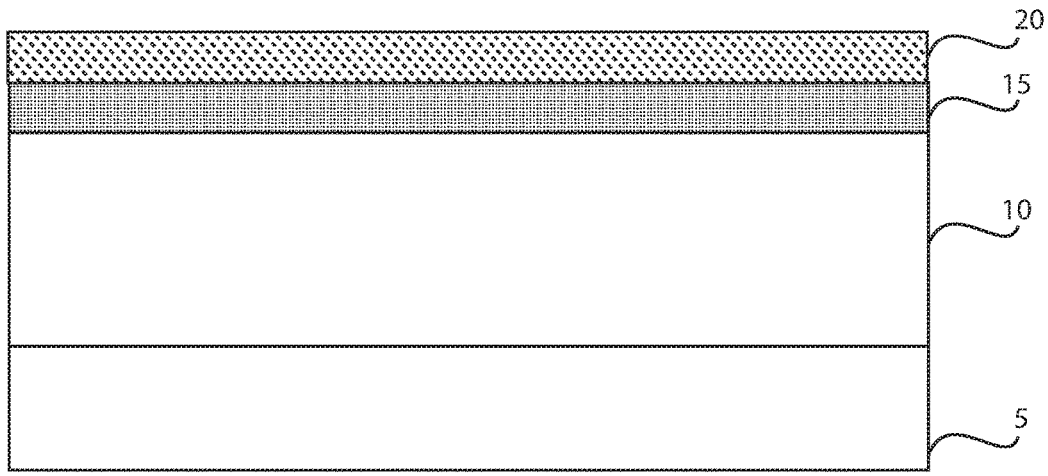
FIG. 2 is a side cross-sectional view depicting one embodiment of depositing a first doped oxide layer on an entirety of the relaxed surface of the semiconductor substrate, and depositing a first hard mask layer on the first doped oxide layer, in accordance with one embodiment of the present disclosure.

FIG. 2 depicts one embodiment of depositing a first doped oxide layer 15 on an entirety of the relaxed surface, i.e., upper surface of the relaxed semiconductor layer 10, of the semiconductor substrate 5, and depositing a first hard mask layer 20 on the first doped oxide layer 15. The first doped oxide layer 15 is typically doped to a first conductivity type. The term "conductivity type" means that the dopant is either a p-type dopant or an n-type dopant. In some embodiments, the first conductivity type dopant used in the first doped oxide layer 15 is a p-type dopant, because the first dopant oxide layer 15 is used to form a punch through stop (PTS) region in the first region of the substrate 5 for an n-type semiconductor device that is to be formed therein. The conductivity type of the punch through stop region is opposite the conductivity type of the semiconductor device formed using the fin structure including the punch through stop region. The opposite conductivity type of a p-type dopant is an n-type dopant, and the opposite conductivity type of an n-type dopant is a p-type dopant. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

In one example of the embodiment that is depicted in FIG. 2, the first doped oxide layer 15 may be silicate glass doped with an p-type dopant, such as boron. The first doped oxide layer 15 may be referred to as a doped glass layer. In one example, the doped glass layer may include boron doped silicate glass (BSG). It is noted that the above example is provided for illustrative purposes only and is not intended to limit the present disclosure, as other p-type dopants may be integrated into the doped oxide layer 15, e.g., doped glass. The first doped oxide layer 15 having the first conductivity type dopant may be deposited using chemical vapor deposition (CVD), such as plasma enhanced CVD (PECVD) or metal organic chemical vapor deposition (MOCVD). The first doped oxide layer 15 may also be formed using chemical solution deposition or spin on deposition, e.g., spin on glass deposition. The dopant may be introduced to the doped glass layer in-situ. By "in-situ" it is meant that the dopant e.g., n-type or p-type, that is being introduced to the first doped oxide layer 15 is introduced during the deposition step that forms the first doped oxide layer 15. In some embodiments, the thickness of the first doped oxide layer 15 may range from 2 nm to 50 nm. In other embodiments, the thickness of the first doped oxide layer 15 ranges from 5 nm to 25 nm. At this stage of the present disclosure, the first doped oxide layer 15 is blanket deposited atop an entirety of the relaxed semiconductor 10 that is atop the semiconductor substrate 5.

FIG. 2 also depicts forming a first hard mask layer 20 on the first doped oxide 15. The first hard mask layer 20 may be composed of a material that may be etched selectively to the at least one of the first doped oxide layer 15 or the relaxed semiconductor layer 10. The term "selective" as used to describe a material removal process denotes that the rate of material removal for a first material is greater than the rate of removal for at least another material of the structure to which the material removal process is being applied. In some embodiments, the first hard mask layer 20 may be a nitride, such as silicon nitride, oxide, such as silicon oxide, or a silicon oxynitride. In yet other examples, the first hard mask layer 20 can be composed of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), lanthanum aluminate ($LaAlO_3$), zirconium silicate ($ZrSiO_x$) and combinations thereof. It is noted that the above compositions are only examples of dielectric compositions that can be suitable for forming the first hard mask layer 20, and it is not intended that the present disclosure be limited to only those examples. Any material that is suitable for selective etching relative to at least one of the first doped oxide layer 15 and the relaxed semiconductor layer 10 is suitable for use with the present disclosure.

Referring to FIG. 2, the first hard mask layer 20 may be blanket deposited over the entirety of the first doped oxide layer 15. The first hard mask layer 20 may be deposited using chemical vapor deposition (CVD), such as plasma enhanced CVD (PECVD) or metal organic chemical vapor deposition (MOCVD). The first hard mask layer 20 may also be formed using chemical solution deposition or physical vapor deposition. The first hard mask layer 20 may have a thickness ranging from 2 nm to 50 nm. In other embodiments, the thickness of the first hard mask layer 20 ranges from 5 nm to 25 nm.

Figure 3:
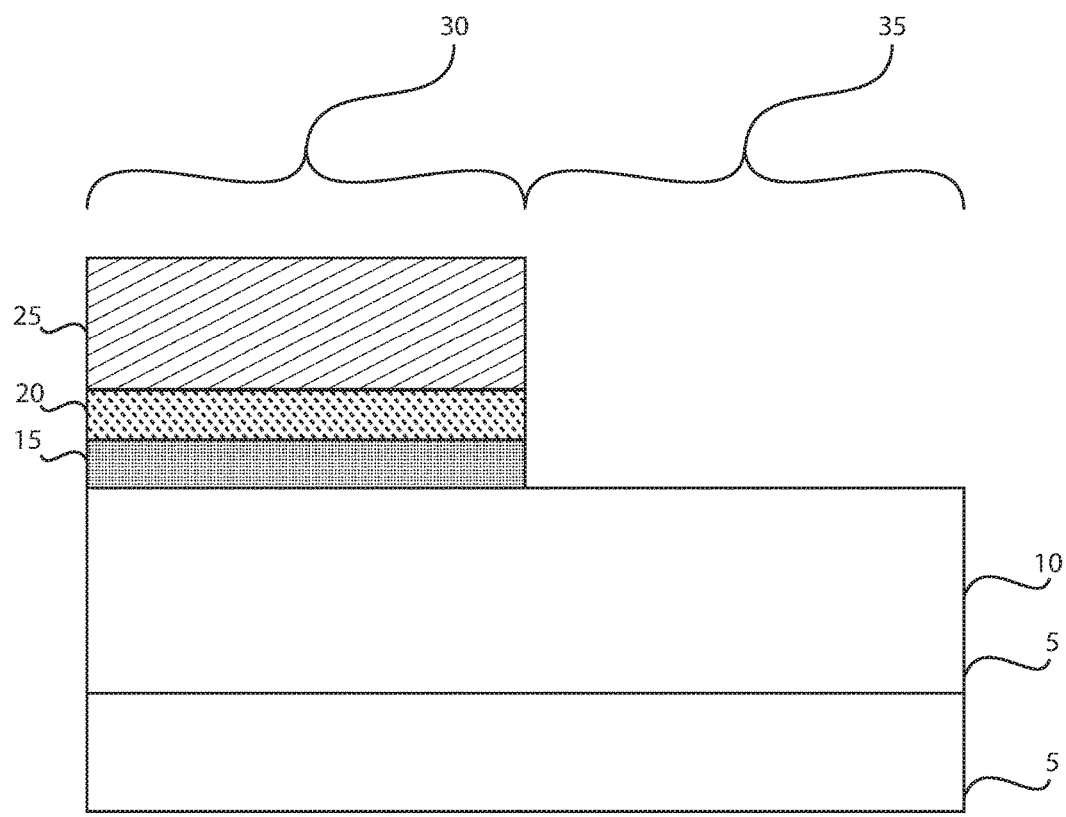
FIG. 3 is a side cross-sectional view depicting patterning a stack of said first hard mask layer and the first doped oxide layer to be present only in a first region of the semiconductor substrate, wherein a second region of the semiconductor substrate is exposed, in accordance with one embodiment of the present disclosure.

FIG. 3 depicts patterning a stack of said first hard mask layer 20 and first hard mask layer 20 to be present only in a first region 30 of the semiconductor substrate 5, wherein a second region 35 of the semiconductor substrate 5 is exposed. In a first step, a portion of the first hard mask layer 20 may be removed from the second region 35 of the semiconductor substrate 5, in which a remaining portion of the first hard mask layer 20 may be present on the first hard mask layer 20 that is present in the first region 30 of the semiconductor substrate 5.

In one embodiment, an etch mask, e.g., photoresist mask 25, may be formed on the first hard mask layer 20 in the first region 30 of the substrate 5. To provide the photoresist mask 25, a photoresist layer is first positioned on the first hard mask layer 20. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer. The developed photoresist mask 25 is present over the first region 30 of the substrate 5 leaving the second region 35 of the substrate 5 including the first hard mask layer 20 present therein exposed.

The exposed portion of the first hard mask layer 20 may be etched using an etch process that is selective to at least the photoresist mask, wherein the portion of the first hard mask layer 20 protected by the photoresist mask 25 remains in the first region 30 of the substrate and the exposed portions of the first hard mask layer 20 are removed from the second region 35 of the substrate 5.

Removing the first hard mask layer 20 from the second region 35 exposes the portion of the first doped oxide layer 15 that is present in the second region 35 of the substrate 5. The exposed portion of the first doped oxide layer 15 that is present in the second region 35 of the substrate 5 may then be removed using an etch that is selective to at least one of the photoresist mask 25 and the relaxed semiconductor layer 10 of the semiconductor substrate 5. The portion of the first doped oxide layer 15 underlying the etch mask 25 remains only in the first region 30 of the substrate 5. The etch process for removing the first doped oxide layer 15 may include reactive ion etch (RIE), plasma etching, ion beam etching or laser ablation/etching.

Following removal of the first doped oxide layer 15, the photoresist mask 25 may be removed. It is noted that the photoresist mask 25 that is depicted in FIG. 3 is the sole, i.e., only mask, that is used to form the first and second punch through stop (PTS) regions of the device.

Figure 4:
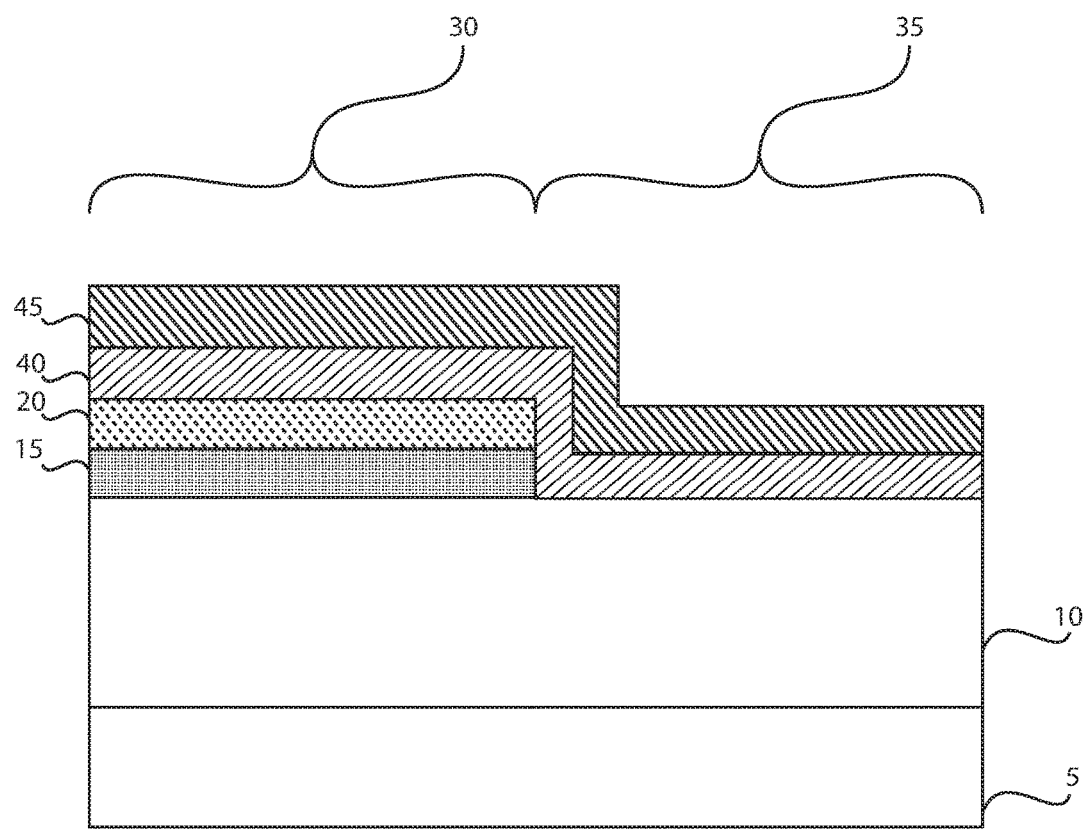
FIG. 4 is a side cross-sectional view depicting depositing a second doped oxide layer on at least the second region of the semiconductor substrate, and depositing a second hard mask layer atop the second doped oxide layer.

FIG. 4 depicts depositing a second doped oxide layer 40 on at least the second region 35 of the semiconductor substrate 5, and depositing a second hard mask layer 45 atop the second doped oxide layer 40. The second doped oxide layer 40 is typically doped to have an opposite conductivity type than the first doped oxide layer 15, because the second doped oxide layer 40 is used to form a punch through stop region in the second region 35 of the substrate 5, and the first doped oxide layer 15 is used to form a punch stop region in the first region 30 of the substrate 5, in which the semiconductor devices that are to be formed in the first region 30 of the substrate 5 will have an opposite conductivity type as the semiconductor devices that are to be formed in the second region 35 of the substrate 5.

In some embodiments, the second doped oxide layer 40 is typically doped to a second conductivity type, which can be an n-type conductivity to form a punch through stop (PTS) region in the second region 35 of the substrate 5 for a p-type semiconductor device that is to be formed therein. For example, in a type IV semiconductor, such as a silicon (Si), germanium (Ge), and silicon germanium (SiGe), examples of n-type dopants, i.e., impurities, include but are not limited to antimony, arsenic and phosphorous. In one example of the embodiment that is depicted in FIG. 4, the second doped oxide layer 40 may be silicate glass doped with an n-type dopant, such as arsenic. The second doped oxide layer 40 may be referred to as a doped glass layer. In one example, the second doped oxide layer 40 may include phosphosilicate glass (PSG) (n-type silicate glass) and arsenosilicate glass (ASG) (n-type silicate glass). It is noted that the above example is provided for illustrative purposes only and is not intended to limit the present disclosure, as other n-type dopants may be integrated into the doped oxide layer 15, e.g., doped glass.

The second doped oxide layer 40 having the second conductivity type dopant may be deposited using chemical vapor deposition (CVD), such as plasma enhanced CVD (PECVD) or metal organic chemical vapor deposition (MOCVD). The second doped oxide layer 40 may also be formed using chemical solution deposition or spin on deposition, e.g., spin on glass deposition. The dopant may be introduced to the doped glass layer in-situ. In some embodiments, the thickness of the second doped oxide layer 40 may range from 2 nm to 50 nm. In other embodiments, the thickness of the second doped oxide layer 40 ranges from 5 nm to 25 nm. At this stage of the present disclosure, second doped oxide layer 40 is blanket deposited atop an entirety of the structure depicted in FIG. 3 with the exception of the photoresist mask 25 that is removed prior to forming the second doped oxide layer 40. For example, the second doped oxide layer 40 is deposited directly atop the remaining portion of the first hard mask layer 20 that is present in the first region 30 of the substrate 5, and is deposited directly on the relaxed semiconductor layer 10 that is present in the second region 35 of the substrate 5.

FIG. 4 further depicts depositing a second hard mask layer 45 atop the second doped oxide layer 40. The second hard mask layer 45 may be deposited atop the second doped oxide layer 40 in both the first region 30 and second region 35 of the substrate 5. The second hard mask layer 45 is similar in composition to the first hard mask layer 15 that is described above with reference to FIG. 2. Therefore, the description of the composition and forming method for the first hard mask layer 15 is suitable to describe at least one embodiment of the second hard mask layer 45 that is depicted in FIG. 4. For example, the second hard mask layer 45 may be composed of chemical vapor deposition (CVD) nitride dielectric, such as silicon nitride dielectric.

It is noted that at this stage of the present disclosure, only a single mask has been employed to forming a first doped oxide layer 15 in direct contact with the relaxed semiconductor layer 10 only in the first region 30 of the substrate 5, and the second doped oxide layer 40 in direct contact with the relaxed semiconductor layer 10 in the second region 35 of the substrate 5. Although the second doped oxide layer 40 is overlying the first region 30 of the substrate 5, it is separated from the first doped oxide layer 15 and the portion of the relaxed semiconductor layer 10 in the first region 30 of the substrate 5 by the first hardmask layer 20. Therefore, the first hardmask layer 20 obstructs the dopant from the second doped oxide layer 40 from diffusing into the first region 30 of the substrate 5.

Figure 5:
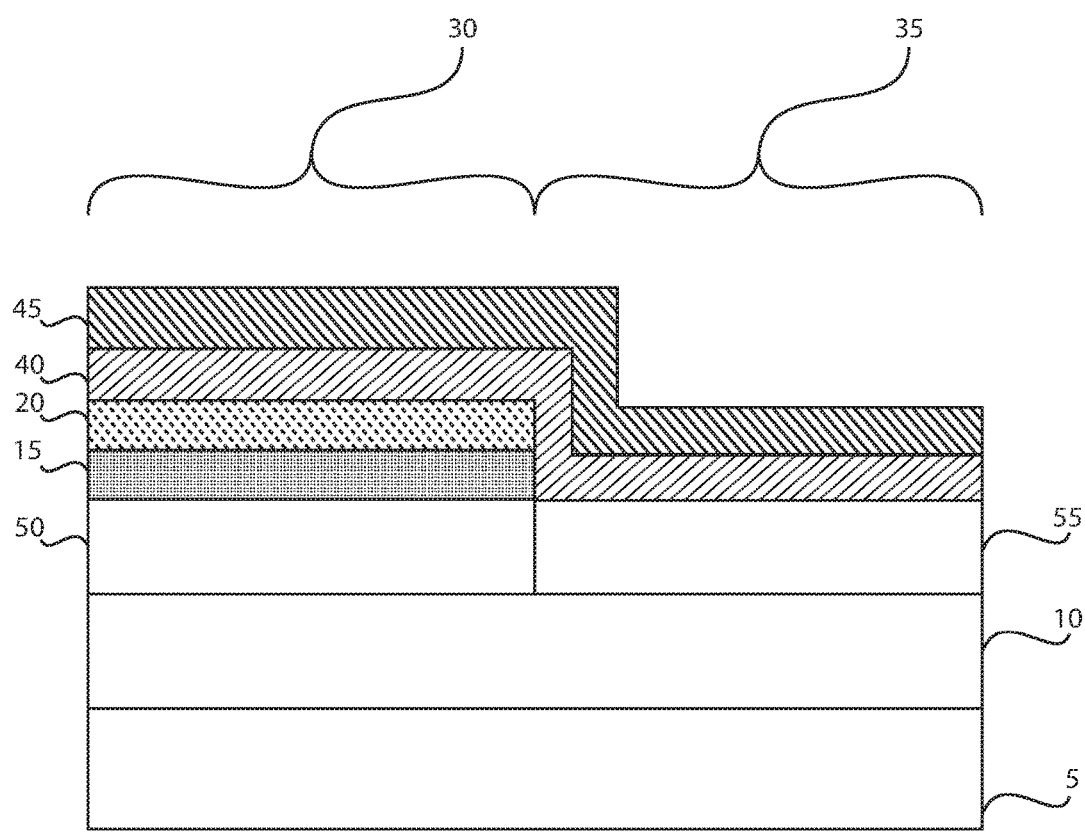
FIG. 5 is a side cross-sectional view depicting diffusing the first and second conductivity type dopants for the first and second doped oxides into the first and second region of the semiconductor substrate, wherein the first conductivity type dopant that diffuses into the first region of the substrate provides a first conductivity type punch through stop region, and the second conductivity type dopant that diffuses into the second region of the substrate provides a second conductivity type punch through stop region, in accordance with one embodiment of the present disclosure.

FIG. 5 depicts one embodiment of diffusing the first and second conductivity type dopants for the first and second doped oxides 15, 40 into the relaxed semiconductor layer 10 that is present in first and second region 30, 35 of the semiconductor substrate 5. The first conductivity type dopant that diffuses from the first doped oxide 15 into the relaxed semiconductor layer 10 in the first region 30 of the substrate 5 provides a first conductivity type punch through stop region 50. For example, the first conductivity type punch through stop region 50 may be composed of silicon germanium (SiGe) doped with a p-type dopant, such as boron. The silicon germanium (SiGe) of the first conductivity type punch through stop region 50 may be relaxed. For example, the silicon germanium (SiGe) of the first conductivity type punch through stop region may include about 25% germanium or less. The concentration of boron dopant in the first conductivity type, i.e., p-type, punch through stop region 50 may range from $1\times10^{18}$ dopants/cm$^3$ to $4\times10^{19}$ dopants/cm$^3$. In another embodiment, the concentration of p-type dopant in the first conductivity type, i.e., p-type, punch through stop region 50 may range from $4\times10^{18}$ dopants/cm$^3$ to $3\times10^{19}$ dopants/cm$^3$.

The second conductivity type dopant that diffuses from the second doped oxide layer 40 into the relaxed semiconductor layer 10 in the second region 35 of the substrate 5 provides a second conductivity type punch through stop region 55. For example, the second conductivity type punch through stop region 55 may be composed of silicon germanium (SiGe) doped with an n-type dopant, such as arsenic or phosphorus. The silicon germanium (SiGe) of the second conductivity type punch through stop region 55 may be relaxed. For example, the silicon germanium (SiGe) of the second conductivity type punch through stop region 55 may include about 25% germanium or less. The concentration of the n-type dopant, e.g., arsenic or phosphorus, dopant in the second conductivity type punch through stop region 55 may range from $1\times10^{18}$ dopants/cm$^3$ to $4\times10^{19}$ dopants/cm$^3$. In another embodiment, the concentration of n-type dopant in the second conductivity type punch through stop region 55 may range from $4\times10^{18}$ dopants/cm$^3$ to $3\times10^{19}$ dopants/cm$^3$.

Diffusing the first and second conductivity type dopants from the first and second doped oxide layers 15, 40 into the relaxed semiconductor layer 10 to provide the first conductivity type punch through stop region 50 and the second conductivity type punch through stop region 55 may include an anneal process. The anneal process may be a thermal diffusion step that can include, but is not limited to, rapid thermal annealing, furnace annealing, laser annealing and combinations thereof. In one embodiment, the thermal diffusion is completed at a first temperature ranging from 350° C. to 1000° C. for a time period ranging from 1 second to 90 seconds. In another embodiment, the thermal annealing process for forming the first conductivity type punch through stop region 50 and the second conductivity type punch through stop region 55 may include a temperature that ranges from 600° C. to 800° C.

In some embodiments, the first conductivity type punch through stop region 50 and the second conductivity type punch through stop region 55 may each have a graded dopant concentration with a highest concentration at an upper surface of the relaxed semiconductor layer 10 that the first and second conductivity type dopants have diffused into, i.e., the upper surface of the relaxed semiconductor layer 10 that was in direct contact with the first and second doped oxide layers 15, 40, which later provides an interface with the later formed strained active region, and a decreasing concentration in punch through dopant in a direction away from the upper surface of the relaxed semiconductor layer 10.

Figure 6:
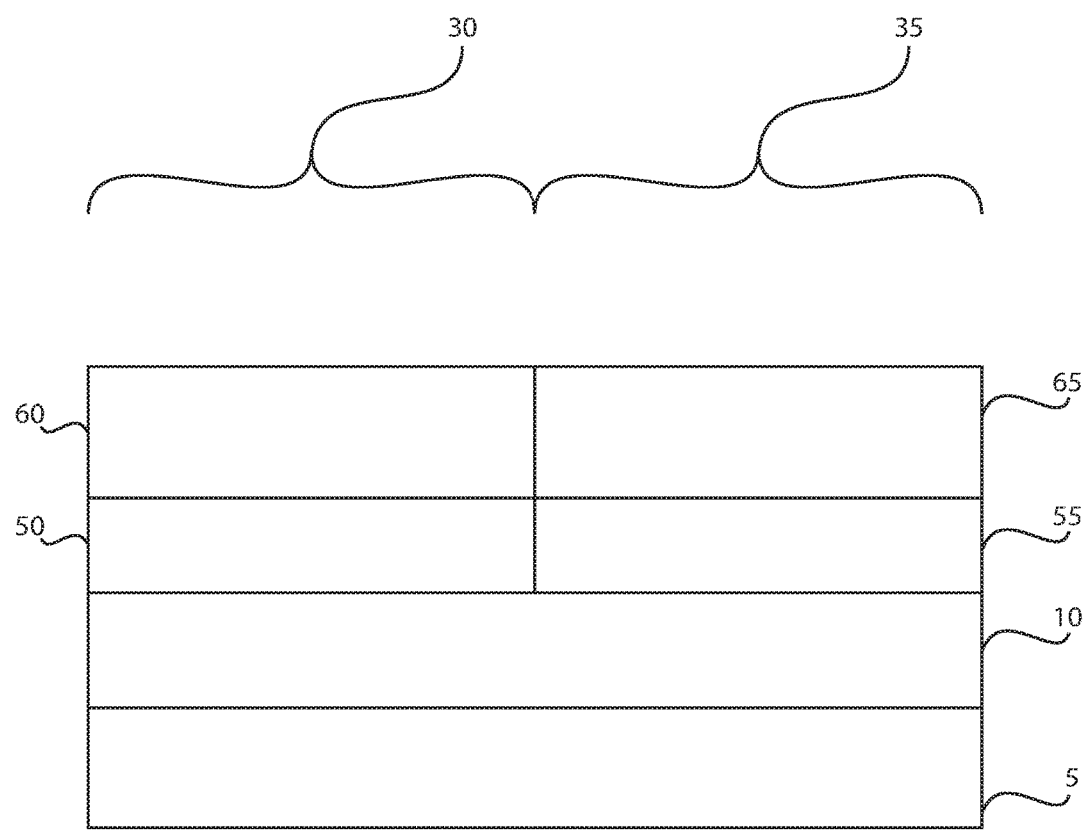
FIG. 6 is a side cross-sectional view depicting removing the first and second doped oxide layers, forming a second semiconductor material having a larger lattice dimension than the first semiconductor material on the second region of the substrate, and forming a third semiconductor material having a lesser lattice dimension than the first semiconductor material on the first region of the substrate, in accordance with the present disclosure.

FIG. 6 depicts one embodiment of removing the first and second doped oxide layers 15, 40, forming a second semiconductor material 65 having a larger lattice dimension than the first semiconductor material of the relaxed semiconductor material layer 10 in the second region 35 of the substrate 5, and forming a third semiconductor material 60 having a lesser lattice dimension than the first semiconductor material of the relaxed semiconductor material layer 10 in the first region 30 of the substrate 5. As used herein, the term "strain" denotes a semiconductor material having a strain greater than about +/-1.0 GPa tensile or compressive.

Removing the first and second doped oxide layers 15, 40 may include etching, planarizing and chemical stripping methods. For example, the first and second doped oxide layers 15, 40 may be removed using an etch process that is selective to the first conductivity type punch through stop region 50 and the second conductivity type punch through stop region 55. Removing the first and second doped oxide layers 15, 40 provides a semiconductor surface suitable for epitaxially depositing semiconductor materials having compressive and tensile strains induced therein.

In a following process step, the method continues with epitaxially growing tensile strained semiconductor material within the first region 30 of the substrate 5 for forming n-type semiconductor devices, and epitaxially growing compressive strained semiconductor material in the second region 35 of the substrate 5 for forming p-type semiconductor devices. For example, epitaxially depositing silicon (Si) atop a relaxed semiconductor material layer of silicon germanium (SiGe) can produce a third semiconductor material 60 having a tensile strain in the first region 30 of the substrate. The tensile strain may provide for increased carrier speed of n-type semiconductor devices formed using the third semiconductor material 60. The lattice constant of germanium is about 4.2 percent greater than that of silicon, and the lattice constant of a SiGe alloy is linear with respect to its' germanium concentration. As a result, the lattice constant of a SiGe alloy containing fifty atomic percent germanium is about 2.1 times greater than the lattice constant of silicon. Epitaxial growth of Si on such a SiGe strain inducing layer yields a Si layer under a tensile strain. It is noted that silicon (Si) is only one example of semiconductor material having a lattice dimension that is less than the lattice dimension of the silicon germanium (SiGe) relaxed semiconductor material layer 10. Other semiconductor materials are equally applicable to the present disclosure. For example to provide a lattice structure suitable for producing a tensile strain, the third semiconductor material layer 60 may also be composed of silicon doped with carbon (Si:C), and silicon germanium (SiGe), in which the germanium (Ge) content is less than the germanium content in the relaxed semiconductor 10 that also includes germanium (Ge).

In one example, in the second region 30 of the substrate 5, the second semiconductor material 65 may be epitaxially formed on the first semiconductor material of the relaxed semiconductor material layer, in which the second semiconductor material 65 has a larger lattice dimension than the first semiconductor material to provide a compressive strain in the second semiconductor material 65. The compressive strain that is induced in the second semiconductor material 65 may increase carrier speed in p-type semiconductor devices that are formed using the second semiconductor material 65. In one example, the second semiconductor material 65 may be composed of silicon germanium (SiGe), in which the germanium content in the second semiconductor material 65 is greater than the germanium content in the relaxed semiconductor material layer 10. For example, when the germanium content in the relaxed semiconductor material layer 10 is less than 25 wt %, the germanium content in the second semiconductor material 65 may be greater than 50 wt %. It is noted that the above example for the composition of the second semiconductor material 65 is provided for illustrative purposes only, and is not intended to limit the present disclosure, as other material are equally suitable for use with the present disclosure.

It is noted that block masks, e.g., photoresist block masks (not shown), may be used to selectively provide the third semiconductor material 60 in the first region 30 of the substrate 5 and the second semiconductor material 65 in the second region 35 of the substrate 5. For example, a first block mask can formed atop the first region 30 leaving the second region 35 exposed. The second region 35 is then processed to provide the second semiconductor material 65. The first block mask can then be removed, and a second block mask may be formed over the second region 35 including the second semiconductor material 65. The second block mask is not formed over the first region 30 of the substrate. Thereafter, the third semiconductor material 60 can be formed on the exposed surface of the relaxed first semiconductor material layer 10. After forming the third semiconductor material having the compressive strain, the second block mask may be removed.

A number of different sources may be used for the deposition of the second and third semiconductor material layers 65, 60. In some embodiments, in which the semiconductor material that forms the second and third semiconductor material layers 65, 60 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the semiconductor material that forms the raised source/drain regions 36 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms second and third semiconductor material layers 65, 60 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

Figure 7:
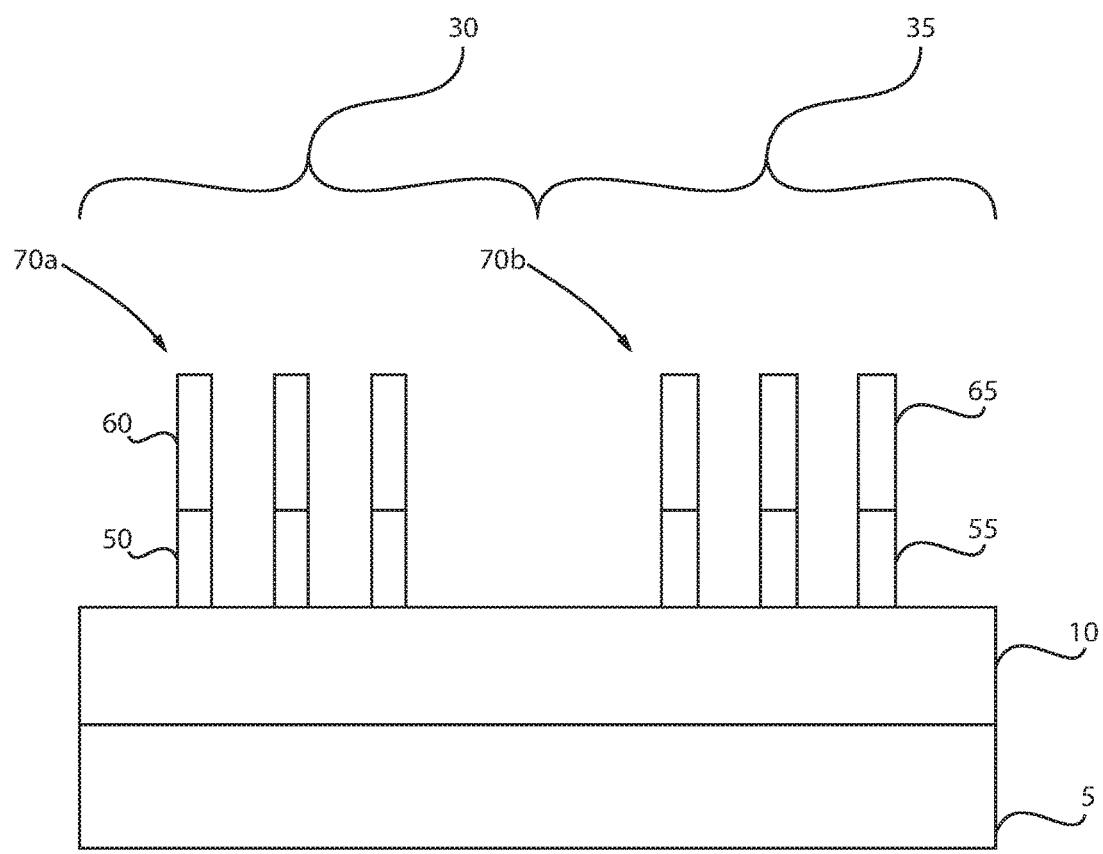
FIG. 7 is a side cross-sectional view depicting patterning the first and third semiconductor material to provide fin structures, in accordance with one embodiment of the present disclose.

FIG. 7 depicts patterning the second and third semiconductor material layers 65, 60, as well as the portion of the relaxed first semiconductor material layer 10 containing the first conductivity type punch through stop region 50, and the second conductivity type punch through stop region 55 to provide fin structures 70a, 70b. The fin structures 70a, 70b may be formed using photolithography and etch processes. In one embodiment, a hard mask is formed on the third semiconductor material 60 and the second semiconductor material 65 prior to etch processing for forming the fin structures 70a, 70b. For example, a hard mask dielectric layer, such as a nitride or oxide material layer, may be blanked deposited atop the bulk semiconductor substrate 1 prior to etching to form the at least one fin structure 10. For example, the hard mask dielectric layer may be blanked deposited using a deposition process, such as chemical vapor deposition (CVD), e.g., plasma enhanced chemical vapor deposition (PECVD), chemical solution deposition, spin on deposition or physical vapor deposition. The hard mask dielectric layer may have a thickness ranging from 2 nm to 15 nm. In some examples, the blanket deposited hard mask dielectric layer may be composed of silicon nitride, e.g., $Si_3N_4$, silicon oxynitride or silicon oxide.

An etch mask, e.g., photoresist mask, may then be formed on the blanket deposited hard mask dielectric layer. To provide the photoresist mask, a photoresist layer is first positioned on the layer of the dielectric material that provides dielectric fin cap. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

The blanket deposited hard mask layer than may be etched using an etch process that is selective to at least the photoresist mask, wherein the portion of the blanket deposited hard mask layer protected by the photoresist mask remain to provide the hard mask 15 and the exposed portions of the blanket deposited hard mask layer are removed. The photoresist mask may then be removed.

The second and third semiconductor material layers 65, 60, as well as the portion of the relaxed first semiconductor material layer 10 containing the first conductivity type punch through stop region 50, and the second conductivity type punch through stop region 55 may then be etched using the hard mask as an etch mask to form the fin structures 70a, 70b. The etch process for forming the at least one fin structure 70a, 70b may be an anisotropic etch. Examples of anisotropic etching that can be used at this point of the present disclosure include ion beam etching, plasma etching or laser ablation. In some embodiments, the etch process for defining the fin structures 70a, 70b can be a timed etch. It is noted that the above description of the etch sequence for forming the fin structures 70a, 70b is only one example, and the present disclosure is not intended to be limited to only this example. For example, the etch process for forming the fin structures 70a, 70b may be included within a sidewall image transfer (SIT) process flow in which a mandrel structure is used to form a spacer, in which following formation of the spacer, the mandrel is removed and the spacer can function as an etch mask.

Still referring to FIG. 7, the etch process may continue until each of the fin structures 70a, 70b may have a height $H_1$ ranging from 5 nm to 200 nm. In another embodiment, each of the fin structures 70a, 70b has a height $H_1$ ranging from 10 nm to 100 nm. In one example, each of the fin structures 70a, 70b has a height $H_1$ ranging from 20 nm to 50 nm. Each of the fin structures 70a, 70b may have a width $W_1$ of less than 15 nm. In another embodiment, each of the fin structures 10 has a width $W_1$ ranging from 3 nm to 8 nm. It is noted that any number of fin structures 70a, 70b may be employed in accordance with the present disclosure.

In the embodiment depicted in FIG. 7 a first set of fin structures 70a is present in the first region 30 of the substrate 5, which may be used for the channel region of a first conductivity type device, e.g., n-type conductivity FinFET, and a second set of fin structures 70b is present in a second region 35 of the substrate 5, which may be used for the channel region of a second conductivity type device, e.g., p-type conductivity FinFET. In some embodiments, the pitch, i.e., center to center, distance separating adjacent fin structures in each of the first and second sets of fin structures 70a, 70b may range 35 nm to 45 nm. In another example, the pitch separating adjacent fin structures may range from 30 nm to 40 nm.

Figure 8:
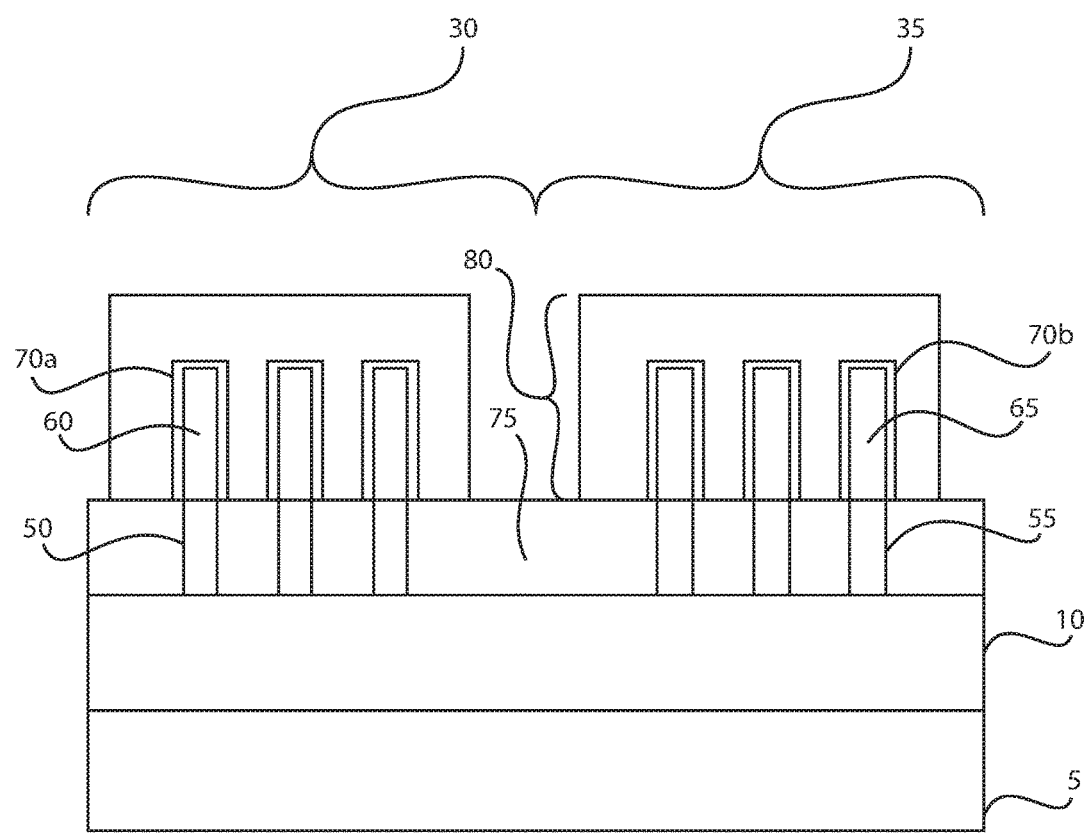
FIG. 8 depicts one embodiment of forming a gate structure to each of the fin structures, in accordance with one embodiment of the present disclosure.

FIG. 8 depicts one embodiment of forming an isolation region 75 between the adjacent fin structures 70a, 70b. The isolation region 75 may be composed of any dielectric material. For example, the isolation region 75 may be composed of an oxide, nitride or oxynitride material. In one example, when the isolation region 35 75 composed of an oxide, the oxide may be silicon oxide. The dielectric material of the isolation region 75 may be formed using a CVD or other like deposition process. The dielectric material that is deposited to form the isolation regions 75 may be recessed to substantially the height of the first and second conductivity type punch through stop regions 50, 55. For example, in one embodiment, the upper surface of the isolation regions 75 is coplanar with an upper surface of the first and second conductivity type punch through stop regions 50, 55. In other examples, the height of the upper surface of the isolation regions 75 is greater than the height of the upper surface of the first and second conductivity type punch through stop regions 50, 55. The upper surface of the isolation region 75 may be recessed using an anisotropic etch, such as reactive ion etch (RIE). The depth by which the isolation region 75 is recessed may provide a height dimension for the active portion of the fin structure 70a, 70b, which is provided by the third semiconductor material 60 and the second semiconductor material 65 of the fin structures 70a, 70b. The dielectric of the isolation region 75 may be densified after deposition. For example, the isolation region 75 may be annealed.

FIG. 8 depicts forming a gate structure 80 on the channel region portion of the active region of each of the fin structures 70a, 70b. The gate structure 80 typically includes at least a gate dielectric 81 that is present on the channel region of active portion the fin structure 70a, 70b, and a gate electrode 82 that is present on the gate dielectric 81. In one embodiment, the at least one gate dielectric layer 81 includes, but is not limited to, an oxide, nitride, oxynitride and/or silicates including metal silicates, aluminates, titanates and nitrides. In one example, when the at least one gate dielectric layer 81 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 81 may vary, but typically, the at least one gate dielectric layer 81 has a thickness from 1 nm to 10 nm. In another embodiment, the at least one gate dielectric layer 81 has a thickness from 1 nm to 3 nm.

The conductive material of the gate electrode 82 may comprise polysilicon, SiGe, a silicide, a metal or a metal-silicon-nitride such as Ta—Si—N. Examples of metals that can be used as the gate electrode 82 include, but are not limited to, Al, W, Cu, and Ti or other like conductive metals. The layer of conductive material for the gate electrode 82 may be doped or undoped. If doped, an in-situ doping deposition process may be employed. Alternatively, a doped conductive material can be formed by deposition, ion implantation and annealing. In yet another embodiment, when the fin structure 70b is being employed in a p-FinFET, the gate electrode may be composed of a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

In yet another embodiment, when the fin structure 70a is being employed in an n-FinFET, the gate electrode 82 may include an n-type work function metal layer. An "n-type work function metal layer" is a metal layer that effectuates an n-type threshold voltage shift. In one embodiment, the work function of the n-type work function metal layer ranges from 4.1 eV to 4.3 eV. In some embodiments, the n-type work function metal layer is composed of at least one of TiAl, TanN, TiN, HfN, HfSi, or combinations thereof.

The gate structure 80 may be formed by using a deposition method, such as a chemical vapor deposition method and/or a physical vapor deposition (PVD), to deposit the material layers for the at least one gate dielectric layer 81 and the at least one gate electrode 82 followed by photolithography and etch processing.

Figure 9:
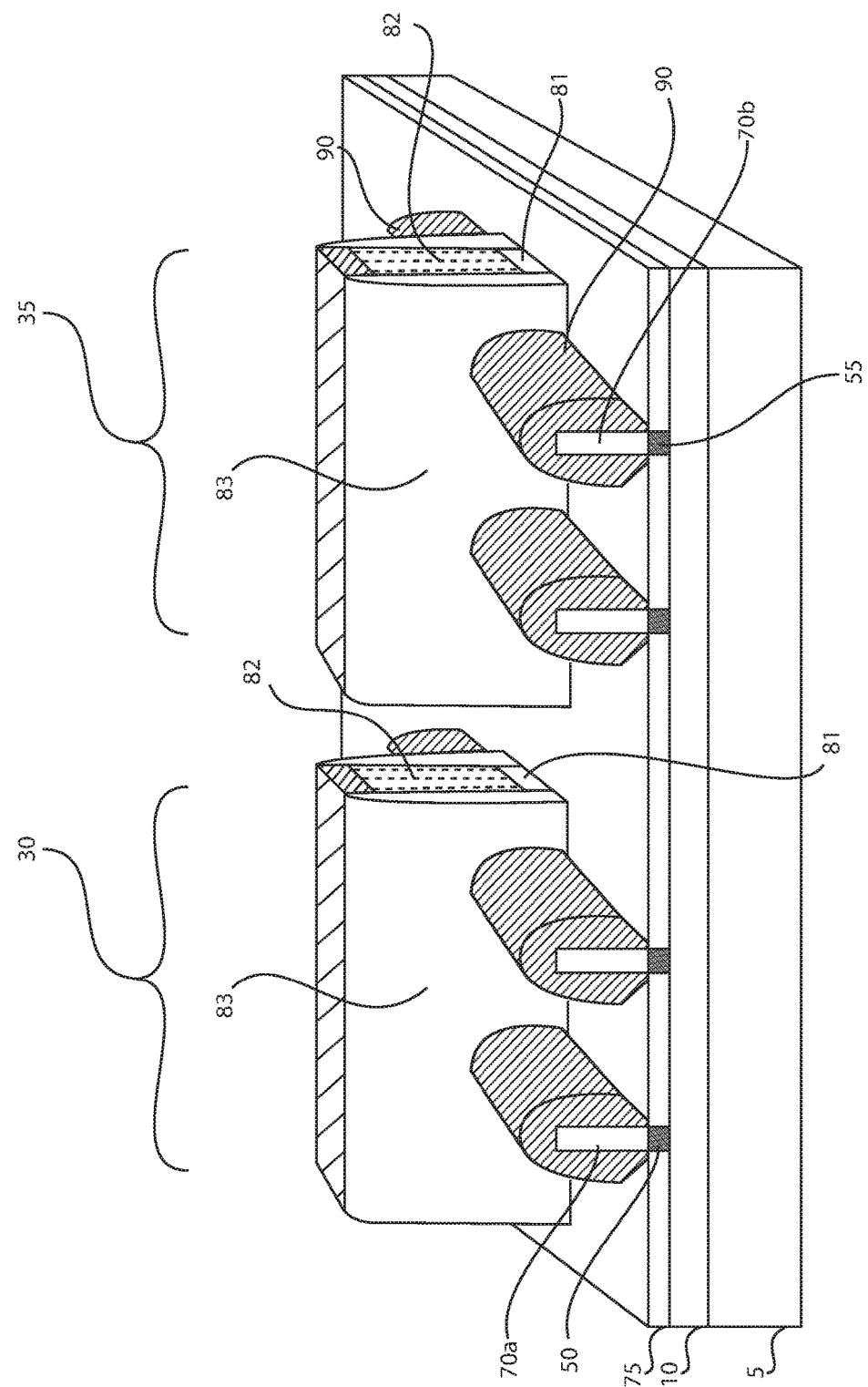
FIG. 9 is a perspective view depicting forming the source and drain regions of a first semiconductor device having a second conductivity type in the region of the semiconductor substrate, and forming the source and drain regions of a second semiconductor device having a first conductivity type in the second region of the semiconductor substrate, in accordance with one embodiment of the present disclosure.

In some embodiments, a gate sidewall spacer 83 can be formed on the sidewall of the gate structure 80, as depicted in FIG. 9. It is noted that in FIG. 9 only two fin structures 70a, 70b are shown for each of the first and second substrate region 30, 35. This is done for simplicity, as any number of fin structures 70a, 70b may be present in each of the first and second region 30, 35 of the substrate 5. In one embodiment, the gate sidewall spacer 83 may be formed by using a blanket layer deposition process, such as CVD, and an anisotropic etchback method. The gate sidewall spacer 83 may have a width ranging from 2.0 nm to 15.0 nm, and may be composed of a dielectric, such as a nitride, oxide, oxynitride, or a combination thereof.

FIG. 9 depicts one embodiment of forming source and drains on the source and drain region portions of the fin structures 70a, 60b that are present on opposing sides of the fin structure's channel region. The source and drain regions, as well as the channel region, are formed in the active portion of the fin structure 70a, 70n, which is separated from the supporting substrate 1 by the isolating portion of the fin structure 70a, 70b. Although FIG. 9 is a perspective view, that only depicts one of the source and drain regions, the other of the source and drain regions is present on the opposing side of the gate structure 40.

The source and drain regions typically include an epitaxial semiconductor material 90 that is formed on the source and drain region portions of the active portion of the fin structure 70a, 70b. The epitaxial semiconductor material 90 for the source and drain regions may be a type IV s semiconductor, such as silicon (Si), silicon germanium (SiGe), germanium (Ge), silicon doped with carbon (Si:C), or the epitaxial semiconductor material 50 for the source and drain regions may be at type III-V compound semiconductor material, such as gallium arsenide (GaAs). The epitaxial semiconductor material 90 may be doped to the conductivity type of the source and drain region. For example, if the semiconductor device is an n-type FinFET, the epitaxial semiconductor material 90 that is present on the source and drain region portions of the fin structure 70a, 70b is doped to an n-type conductivity; and if the semiconductor device is a p-type FinFET, the epitaxial semiconductor material 90 that is present on the source and drain region portions of the fin structure 70a, 70b is doped to a p-type conductivity. The n-type or p-type dopant in the source and drain regions may also be referred to a charge carrier type dopant.

The dopant may be introduced to the epitaxial semiconductor material 90 using in-situ doping. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material. In some embodiments, extension source and drain regions may be formed in the source and drain region portions of the active portion of the fin structure 70a 70b by thermally diffusing the dopant from the epitaxial semiconductor material 90 into the active portion of the fin structures 70a, 70b. In some embodiments, the charge carrier type dopant in said source and drain region is present in a concentration ranging from $1 \times 10^{20}$ dopants/cm$^3$ to $2 \times 10^{20}$ dopants/cm$^3$.

In some examples, the conductivity type of the source and drain regions indicates the conductivity type of the device. For example, a p-type FinFET would have p-type source and drain regions, and an n-type FinFET would have n-type source and drain regions. The dopant conductivity type of the source and drain regions is typically opposite the conductivity type of the punch through stop region. Therefore, in the first region 30 of the substrate 5, in which the first conductivity type punch through stopper region 50 is present, the source and drain regions are doped to a second conductivity type. For example, if the first conductivity type punch through stop region 50 that is present in the first region 30 of the substrate 5 has a p-type conductivity, the semiconductor device, e.g., FinFET, formed on the fin structures 70a in the first region 30 will be n-type devices, e.g., n-type FinFETs. For example, if the second conductivity type punch through stop region 55 that is present in the second region 35 of the substrate 5 has an n-type conductivity, the semiconductor device, e.g., FinFET, formed on the fin structures 70b in the second region 35 will be p-type devices, e.g., p-type FinFETs. By having an opposite conductivity type as the conductivity type of the FinFET, the punch through stop (PST) region produces a repulsive field underlying the active portion of the FinFET that obstructs leakage of charge carriers out of the active portion of the fin structure 70a, 70b.

It is noted that in the above examples, a gate first process has been described for forming the gate structure 80. The methods and structures of the present disclosure are not limited to only this process flow, as gate last processing is also suitable for use with the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

In another aspect, the present disclosure provides a semiconductor device that includes a fin structure 70a, 70b having a strained active region portion (provided by the second semiconductor material 65 and the third semiconductor material 60), and a punch through stop region 50, 55 underlying the strained active region. The punch through stop region 50, 55 may have a graded dopant concentration with a highest concentration at an interface with the strained active region, and a decreasing concentration in punch through dopant in a direction away from the interface with the strained active region. The doping gradient of the first and second conductivity type punch through stop regions may be characterized by an electrical mobility measurement or random dopant fluctuation (RDF) measurements which are highly depend on the doping in the channel Fin.

The semiconductor device further includes a gate structure 80 on a channel portion of the strained active region portion of the fin structure 70a, 70b and source and drain regions on opposing sides of the channel portion. In some embodiments, in which the strained active region (provided by the third semiconductor material 60) is tensile strained, the strained active region is comprised of silicon, the source and drain regions are doped to an n-type conductivity, the punch through stop region 55 includes a p-type conductivity, and the punch through stop region 55 is present in a relaxed silicon germanium material portion of the fin structure 70a. In some embodiments, in which the strained active region (provided by the second semiconductor material 65) is compressive strained, the strained active region is comprised of silicon germanium having greater than 50% germanium, the source and drain regions are doped to a p-type conductivity, the punch through stop region 55 includes a n-type conductivity, and the punch through stop region 55 is present in a relaxed silicon germanium material portion of the fin structure 70a, the relaxed silicon germanium material portion including less than 25% germanium.

The punch through dopant in the punch through stop (PTS) region 50, 55 of the fin structures 70a, 70b may be present in a concentration ranging from $4 \times 10^{18}$ dopants/cm$^3$ to $3 \times 10^{19}$ dopants/cm$^3$. The punch through dopant from the punch through stop (PTS) region 50, 55 is typically not present in the channel region, as well as the other portions of the active region, e.g., third and second semiconductor material 60, 65, of the fin structures 70a, 70b. For example, the concentration of punch through stopper dopant that can be present in the active portion of the fin structure 70a, 70b using the methods described with reference to FIGS. 1-9 is orders of magnitude less than the concentration of the punch through stopper dopant that is present in the channel region of device formed using prior methods, such as ion implantation. For example, the maximum amount of punch through dopant that can be possible in the active region of the semiconductor devices that are formed in accordance with the present disclosure can be no greater than 1e17 dopants/cm$^3$.

In some embodiments, the methods and structures disclosed herein provide fin structures having no ion implantation related damages to the strained channels. Further, the punch through stop (PTS) region doping is present underneath the fin channel with no dopant fluctuation in the fin channel. Additionally, a single mask may be used to form both the n-type punch through stop region and the p-type punch through stop region in a complementary metal oxide semiconductor (CMOS) device arrangement.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming semiconductor device comprising:

diffusing a punch through dopant from an oxide into a first semiconductor material having a first lattice dimension to provide a punch through stop region;

removing the oxide from the first semiconductor material;

forming a second semiconductor material having a second lattice dimension on the first semiconductor material having the first lattice dimension, wherein a difference between the first lattice dimension and the second lattice dimension forms a strain in the second semiconductor material; and forming a gate structure and source and drain regions on the second semiconductor material to provide the semiconductor device, wherein a channel region of the semiconductor device that is present under the gate structure is in direct contact with the punch through stop region.

2. The method of claim 1, wherein the second semiconductor material has a larger lattice dimension than the first semiconductor material, and the strain in the second semiconductor material is compressive.

3. The method of claim 2, wherein the punch through dopant is n-type, and the source and drain regions are p-type.

4. The method of claim 1, wherein the second semiconductor material has a smaller lattice dimension than the first semiconductor material, and the strain in the second semiconductor material is tensile.

5. The method of claim 4, wherein the punch through dopant is p-type and the source and drain regions are n-type.

6. A method of forming a semiconductor device comprising:

forming a first doped oxide having a first conductivity type dopant on a first region of a semiconductor substrate having a first lattice dimension, and forming a second doped oxide having a second conductivity type dopant on a second region of the semiconductor substrate;

diffusing the first and second conductivity type dopants from the first and second doped oxides into the first and second region of the semiconductor substrate, wherein the first conductivity type dopant that diffuses into the first region of the substrate provides a first conductivity type punch through stop region, and the second conductivity type dopant that diffuses into the second region of the substrate provides a second conductivity type punch through stop region;

removing the first and second doped oxides;

forming at least a second semiconductor material having at least a second lattice dimension on the semiconductor substrate, wherein a difference between the first lattice dimensions and at least the second lattice dimension forms a strain in said at least said second semiconductor material layer;

forming a first semiconductor device having a second conductivity type in the first region of the semiconductor substrate; and forming a second semiconductor device having a first conductivity type in the second region of the semiconductor substrate, wherein a channel region for each of the first and second semiconductor device is in direct contact with their respective first and second punch through stop region.

7. The method of claim 6, wherein said semiconductor substrate comprises a relaxed semiconductor layer atop a bulk semiconductor substrate.

8. The method of claim 7, wherein said forming the first doped oxide having said first conductivity type dopant on the first region of the semiconductor substrate and said forming a second doped oxide having said second conductivity type dopant on said second region of the semiconductor substrate comprises:
- depositing said first doped oxide on an entirety of said semiconductor substrate;
- depositing a first hard mask layer on said first doped oxide;
- patterning a stack of said first hard mask layer and said first doped oxide to be present only in said first region of the semiconductor substrate, wherein said second region of the semiconductor substrate is exposed;
- depositing a second doped oxide on at least the second region of the semiconductor substrate; and
- depositing a second hard mask layer atop the second doped oxide.

9. The method of claim 6, wherein diffusing the first and second conductivity type dopants for the first and second doped oxides into the first and second region of the semiconductor substrate comprises thermal annealing.

10. The method of claim 9, wherein removing the first and second doped oxides comprises a strip process that also removes the first and second hard masks.

11. The method of claim 6, wherein forming said at least a second semiconductor material having at least a second lattice dimension comprises:
- forming said second semiconductor material having a larger lattice dimension than the first semiconductor material on the second region of the substrate, and the strain in the second semiconductor material being compressive; and
- forming a third semiconductor material having a lesser lattice dimension than the first semiconductor material on the first region of the substrate, the strain in the third semiconductor material being tensile.

12. The method of claim 11, further comprising forming a gate structure on a channel region of each of the first and second semiconductor devices, and forming source and drain regions on opposing sides of the channel region for the first and second semiconductor devices.

13. The method of claim 12, wherein the first conductivity type punch through stop region dopant is n-type.

14. The method of claim 11, wherein the source and drain regions of the first semiconductor device are p-type.

15. The method of claim 14, wherein the second conductivity type punch through stop region dopant is p-type.

16. The method of claim 15, wherein the source and drain regions of the second semiconductor device are n-type.

17. A method of forming a semiconductor device comprising:
- diffusing first and second conductivity type dopants from first and second doped oxides into first and second regions of a semiconductor substrate, wherein the first conductivity type dopant that diffuses into the first region of the substrate provides a first conductivity type punch through stop region, and the second conductivity type dopant that diffuses into the second region of the substrate provides a second conductivity type punch through stop region;
- forming at least a second semiconductor material having at least a second lattice dimension on the semiconductor substrate, wherein a difference between the first lattice dimensions and at least the second lattice dimension forms a strain in said at least said second semiconductor material layer;
- forming a first semiconductor device having a second conductivity type in the first region of the semiconductor substrate; and
- forming a second semiconductor device having a first conductivity type in the second region of the semiconductor substrate, wherein a channel region for each of the first and second semiconductor device is in direct contact with their respective first and second punch through stop region.

18. The method of claim 17, wherein said semiconductor substrate comprises a relaxed semiconductor layer atop a bulk semiconductor substrate.

19. The method of claim 17, wherein said forming the first doped oxide having said first conductivity type dopant on the first region of the semiconductor substrate and said forming a second doped oxide having said second conductivity type dopant on said second region of the semiconductor substrate comprises:
- depositing said first doped oxide on an entirety of said semiconductor substrate;
- depositing a first hard mask layer on said first doped oxide;
- patterning a stack of said first hard mask layer and said first doped oxide to be present only in said first region of the semiconductor substrate, wherein said second region of the semiconductor substrate is exposed;
- depositing a second doped oxide on at least the second region of the semiconductor substrate; and
- depositing a second hard mask layer atop the second doped oxide.

20. The method of claim 17, wherein diffusing the first and second conductivity type dopants for the first and second doped oxides into the first and second region of the semiconductor substrate comprises thermal annealing.

* * * * *